US009561768B2

(12) United States Patent
Lamesch

(10) Patent No.: US 9,561,768 B2
(45) Date of Patent: *Feb. 7, 2017

(54) CAPACITIVE SENSING DEVICE

(71) Applicant: IEE INTERNATIONAL ELECTRONICS & ENGINEERING S.A., Echternach (LU)

(72) Inventor: Laurent Lamesch, Reichlange (LU)

(73) Assignee: IEE International Electronics & Engineering S.A., Echternach (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/783,795

(22) PCT Filed: Apr. 7, 2014

(86) PCT No.: PCT/EP2014/056955
§ 371 (c)(1),
(2) Date: Oct. 9, 2015

(87) PCT Pub. No.: WO2014/166881
PCT Pub. Date: Oct. 16, 2014

(65) Prior Publication Data
US 2016/0075297 A1  Mar. 17, 2016

(30) Foreign Application Priority Data
Apr. 9, 2013 (LU) .......................... 92178

(51) Int. Cl.
*G01R 31/02* (2006.01)
*G01R 27/26* (2006.01)
(Continued)

(52) U.S. Cl.
CPC ......... *B60R 21/01532* (2014.10); *B60N 2/002* (2013.01); *B60N 2/5685* (2013.01);
(Continued)

(58) Field of Classification Search
CPC ......... B60N 2/002; B60N 2/5685; G01D 5/24; H05B 1/0272; H05B 37/02
(Continued)

(56) References Cited

U.S. PATENT DOCUMENTS 5,668,446 A  *  9/1997  Baker ................... H05B 37/02
                                                315/158
6,161,070 A     12/2000  Jinno et al.
(Continued)

FOREIGN PATENT DOCUMENTS

DE            4338285 A1    5/1995
DE       102007059702 A1    7/2008
(Continued)

OTHER PUBLICATIONS

International Search Report and Written Opinion issued Jul. 1, 2014 re: Application No. PCT/EP2014/056552; pp. 1-7.
(Continued)

*Primary Examiner* — Vincent Q Nguyen
(74) *Attorney, Agent, or Firm* — Reising Ethington P.C.

(57) ABSTRACT

A capacitive sensing device includes an antenna electrode for emitting an alternating electric field in response to an alternating voltage caused in the antenna electrode and a control and evaluation circuit configured to maintain the alternating voltage equal to an alternating reference voltage by injecting a current into the antenna electrode and to measure the current. The control and evaluation circuit includes a microcontroller with a digital output for providing a digital signal and a low-pass filter operatively connected to the digital output for generating the alternating reference voltage by low-pass-filtering the digital signal.

14 Claims, 1 Drawing Sheet

(51) Int. Cl.
| | |
|---|---|
| *B60R 21/015* | (2006.01) |
| *B60N 2/56* | (2006.01) |
| *G01D 5/24* | (2006.01) |
| *H03K 17/955* | (2006.01) |
| *B60N 2/00* | (2006.01) |
| *G01V 3/02* | (2006.01) |
| *H05B 1/02* | (2006.01) |

(52) U.S. Cl.
CPC ........... *B60R 21/0154* (2014.10); *G01D 5/24* (2013.01); *G01V 3/02* (2013.01); *H03K 17/955* (2013.01); *H05B 1/0272* (2013.01); *H03K 2217/960735* (2013.01)

(58) Field of Classification Search
USPC .......................... 324/658, 660–663, 679, 686
See application file for complete search history.

(56) References Cited

U.S. PATENT DOCUMENTS

| | | |
|---|---|---|
| 6,392,542 B1 | 5/2002 | Stanley |
| 6,703,845 B2 | 3/2004 | Stanley et al. |
| 7,521,940 B2 | 4/2009 | Koch et al. |
| 8,219,331 B2 | 7/2012 | Gulba et al. |
| 2006/0187038 A1* | 8/2006 | Shieh ....................... G01B 7/14 340/562 |
| 2009/0295199 A1 | 12/2009 | Kincaid et al. |
| 2010/0295563 A1* | 11/2010 | Bieck ..................... B60N 2/002 324/679 |
| 2011/0012618 A1 | 1/2011 | Teterwak et al. |
| 2011/0084709 A1 | 4/2011 | Asjes et al. |
| 2013/0015863 A1* | 1/2013 | Lamesch ................ B60N 2/002 324/663 |

FOREIGN PATENT DOCUMENTS

| | | |
|---|---|---|
| DE | 112011101945 T5 | 4/2013 |
| WO | 9217344 A1 | 10/1992 |

OTHER PUBLICATIONS

International Search Report and Written Opinion issued Jul. 8, 2014 re: Application No. PCT/EP2014/056955; pp. 1-10.

J. Smith et al. "Electric Field Sensing for Graphical Interfaces", IEEE Computer Graphics and Applications, IEEE Service Center; May 1, 1998; vol. 18, No. 3, pp. 54-60.

* cited by examiner

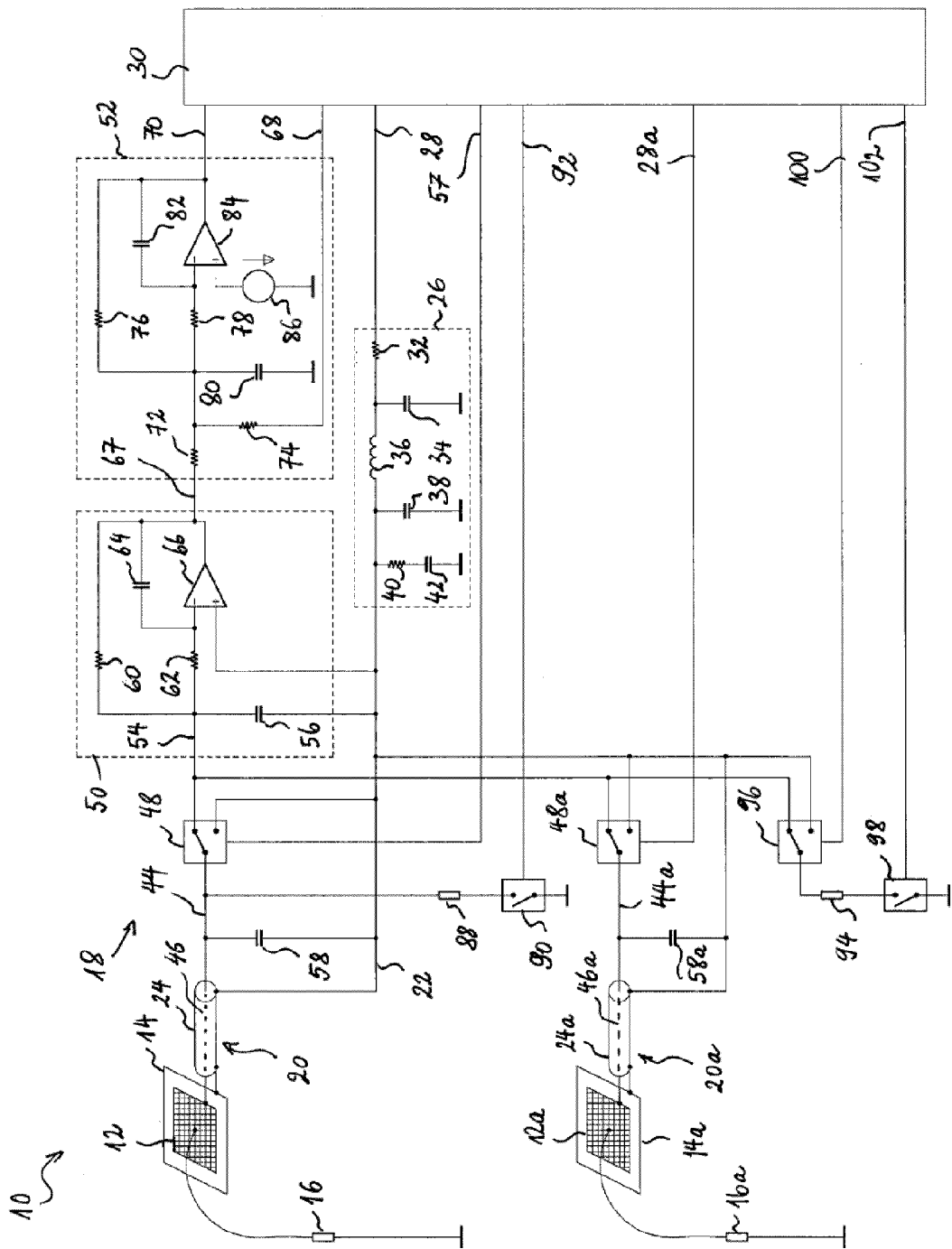

CAPACITIVE SENSING DEVICE

TECHNICAL FIELD

The present invention generally relates to a capacitive sensing device, e.g. for detecting the absence or presence of an occupant seated on a vehicle seat.

BACKGROUND OF THE INVENTION

A capacitive sensor or capacitive sensing device, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode at which the influence of an object or living being on the electric field is detected. In some (so-called "loading mode) capacitive occupancy sensors, the one or more antenna electrodes serve at the same time as sensing electrodes. In this case, the measurement circuit determines the current flowing into the one or more antenna electrodes in response to an oscillating voltage being applied to them. The relationship of voltage to current yields the complex impedance between the one or more antenna electrodes and ground. In an alternative version of capacitive sensors ("coupling mode" capacitive sensors), the transmitting antenna electrode(s) and the sensing electrode(s) are separate from one another. In this case, the measurement circuit determines the current or voltage that is induced in the sensing electrode when the transmitting antenna electrode is operating.

The different capacitive sensing mechanisms are explained in the technical paper entitled "Electric Field Sensing for Graphical Interfaces" by J. R. Smith, published in Computer Graphics I/O Devices, Issue May/June 1998, pp 54-60. The paper describes the concept of electric field sensing as used for making non-contact three-dimensional position measurements, and more particularly for sensing the position of a human hand for purposes of providing three-dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling. "Shunt mode" is alternatively referred to as the above-mentioned "coupling mode".

Capacitive occupant sensing systems have been proposed in great variety, e.g. for controlling the deployment of one or more airbags, such as e.g. a driver airbag, a passenger airbag and/or a side airbag. U.S. Pat. No. 6,161,070, to Jinno et al., relates to a passenger detection system including a single antenna electrode mounted on a surface of a passenger seat in an automobile. An oscillator applies on oscillating voltage signal to the antenna electrode, whereby a minute electric field is produced around the antenna electrode. Jinno proposes detecting the presence or absence of a passenger in the seat based on the amplitude and the phase of the current flowing to the antenna electrode.

U.S. Pat. No. 6,392,542, to Stanley, teaches an electric field sensor comprising an electrode mountable within a seat and operatively coupled to a sensing circuit, which applies to the electrode an oscillating or pulsed signal having a frequency "at most weakly responsive" to wetness of the seat. Stanley proposes to measure phase and amplitude of the current flowing to the electrode to detect an occupied or an empty seat and to compensate for seat wetness.

Others had the idea of using the heating element of a seat heater as an antenna electrode of a capacitive occupancy sensing system. WO 92/17344 A1 discloses a an electrically heated vehicle seat with a conductor, which can be heated by the passage of electrical current, located in the seating surface, wherein the conductor also forms one electrode of a two-electrode seat occupancy sensor.

WO 95/13204 discloses a similar system, in which the oscillation frequency of an oscillator connected to the heating element is measured to derive the occupancy state of the vehicle seat. More elaborate combinations of a seat heater and a capacitive sensor are disclosed, for instance, in U.S. Pat. No. 7,521,940, US 2009/0295199 and U.S. Pat. No. 6,703,845.

BRIEF SUMMARY

The present invention provides a capacitive sensing device (which may be combined or not with a heating element), which can be manufactured at a competitive price.

In accordance with a first preferred aspect of the invention, a capacitive sensing device comprises an antenna electrode for emitting an alternating electric field in response to an alternating voltage caused in the antenna electrode and a control and evaluation circuit configured to maintain the alternating voltage equal to an alternating reference voltage by injecting a current into the antenna electrode and to measure the current. The control and evaluation circuit includes a microcontroller with a digital output for providing a digital signal and a low-pass filter operatively connected to the digital output for generating the alternating reference voltage by low-pass-filtering the digital signal.

As will be appreciated, the invention takes advantage from the presence of a microcontroller within the control and evaluation circuit for the generation of the alternating reference voltage. Since nowadays' capacitive sensors anyway typically comprise a microcontroller for processing the measurements and/or communicating with other devices, low-pass-filtering a digital signal for generating the substantially sinusoidal alternating reference voltage represents a very cost-efficient alternative to prior solutions (typically using active components, such as e.g. an oscillator or circuits with transistors and operational amplifiers).

Preferably, the capacitive sensing device comprises a driven shield electrode operatively connected to the low-pass filter for having the alternating reference voltage applied to. A driven shield electrode may be used, in particular, in applications where the antenna electrode is arranged relatively close to a grounded surface. In this case, a driven shield electrode may be arranged between the antenna electrode and the grounded surface, thus reducing the capacitance between the antenna electrode and the grounded surface and making the capacitive sensing device more sensitive to smaller changes of that capacitance, which are e.g. caused by the proximity of a person's hand or body.

If the antenna electrode is arranged at a certain distance from the control and evaluation circuit, the capacitive sensing device preferably comprises a shielded cable, including a core conductor and a shield conductor surrounding the core conductor, with the antenna electrode being operatively connected with the control and evaluation circuit via the core conductor and with the driven shield electrode being operatively connected to the low-pass filter via the shield conductor. The shield conductor prevents the wire between the antenna electrode and the control and evaluation circuit to capacitively couple to ground, which would otherwise induce an undesirable measurement offset that depends on the length of the wire.

The low-pass filter operatively connected to the digital output preferably comprises an LC low-pass filter.

According to a preferred embodiment of the invention, the capacitive sensing device comprises at least one normative impedance controlledly switchable in parallel to the antenna electrode with a switch arranged in series with the at least one normative impedance and controlled by the microcontroller.

The control and evaluation circuit preferably comprises a transimpedance amplifier having a current input operatively connected to the antenna electrode, a reference voltage input operatively connected to the low-pass-filter for receiving the alternating reference voltage and an output operatively connected with the current input via a feedback network. The transimpedance amplifier is preferably configured for preventing a difference in electrical potential between the current input and the reference voltage input by causing a current to flow across the reference network and into the antenna electrode, the output being configured to output a measurement voltage indicative of the current.

The microcontroller advantageously comprises a measurement input, with the output of the transimpedance amplifier being operatively connected with the measurement input via a further low pass filter (with gain), the further low-pass filter including an offset correction circuit.

According to a preferred embodiment of the invention, the current input is operatively connected to the antenna electrode via a multiplexer, the multiplexer being configured to switch the antenna electrode alternatingly to the current input and to the reference voltage input. Preferably, the multiplexer is configured to switch the antenna electrode to the current input during a first half of a period of the alternating reference voltage and to the reference voltage input during a second half of the alternating reference voltage.

According to a preferred embodiment of the invention, a first shunt capacitor is connected between the antenna electrode and the reference voltage input of the transimpedance amplifier and a second shunt capacitor is connected between the reference voltage input and circuit ground. As will be appreciated, the first and second shunt capacitors provide for a path from the antenna electrode to circuit ground that bypasses the transimpedance amplifier and the microcontroller. That path has low impedance for high-frequency current components of disturbance or interference currents that may be injected into the antenna electrode.

In accordance with a second preferred aspect of the invention, a capacitive sensing device comprises an antenna electrode for emitting an alternating electric field in response to an alternating voltage caused in the antenna electrode and a control and evaluation circuit that comprises a transimpedance amplifier configured to maintain the alternating voltage equal to an alternating reference voltage on a reference voltage node by injecting a current into the antenna electrode and to measure the current. The control and evaluation circuit comprises a microcontroller and a multiplexer configured and arranged to switch said antenna electrode alternately to a current input of the transimpedance amplifier and to the alternating reference voltage node, the microcontroller being configured to control the multiplexer with a digital control signal. The multiplexer and the transimpedance amplifier and a low-pass filter operatively connected to the transimpedance amplifier form together a synchronous rectifier arrangement. The current input node of the transimpedance amplifier is AC-coupled to the reference voltage node by a protection capacitor. As will be appreciated, the protection capacitor provides a low-impedance path between the current input node and the transimpedance amplifier and thus substantially prevents high-frequency currents from distorting the useful signal components output by the synchronous rectifier. Preferably, a second protection capacitor AC-couples the reference voltage node to circuit ground.

It is worthwhile noting that a capacitive sensing device that is configured in accordance with the further preferred aspect of invention can be, but need not be, configured in accordance with the first preferred aspect of the invention. A preferred embodiment of the invention, however, relates to a capacitive sensing device that unites both the first and the second preferred aspects discussed hereinabove.

Capacitive sensing devices in accordance with the first and/or the second aspect of the invention may be used, for example, in a capacitive trunk opener (which opens the trunk of a car if an approaching leg is detected), in a capacitive door opener, or in integrated capacitive sensing and heating systems, e.g. in a vehicle seat or a steering wheel.

BRIEF DESCRIPTION OF THE DRAWINGS

Further details and advantages of the present invention will be apparent from the following detailed description of a not limiting embodiment with reference to the attached drawing, wherein:

FIG. 1 is a block schematic diagram of a capacitive sensing device in accordance with the preferred aspects of the invention.

DESCRIPTION OF PREFERRED EMBODIMENTS

FIG. 1 shows an embodiment of a capacitive sensing device 10 in accordance with the preferred aspects of the invention. The capacitive sensing device 10 comprises a conductive antenna electrode ("sense electrode") 12 and a conductive driven shield electrode ("guard electrode") 14. Sense and guard electrodes 12, 14 are electrically insulated from each other. The a priori unknown, complex impedance 16 between the sense electrode 12 and ground is the impedance to be measured by the capacitive sensing device 10. Sense electrode 12 and guard electrode 14 are connected to a control and evaluation circuit ("measurement electronics") 18 by a shielded cable 20.

The control and evaluation circuit 18 comprises a conductor, hereinafter referred to as guard node 22, to which a sine voltage with a frequency comprised in the range of 100 kHz to 500 kHz is applied. It shall be noted, however, that variants of the present embodiment may employ other frequencies in the range from 10 kHz to 10 MHz without departing from the scope of the invention. The sine voltage on the guard node 22 is also called the guard voltage or the guard sine wave and represents the above-mentioned alternating reference voltage. The guard node 22 is connected with the guard electrode 14 by the shield conductor 24 of the shielded cable 20.

The sine voltage on the guard node 22 is generated by a low-pass LC filter 26. The guard node 22 corresponds to the output of the low-pass LC filter 26. The input of the low-pass LC filter 26 is connected with a PWM (pulse-width modulation) output 28 of a microcontroller 30, which, during operation, applies a PWM-digital signal (a square wave) with the desired frequency to the low-pass LC filter 26. The low-pass LC filter 26 converts the digital signal into the sinusoidal guard voltage basically by letting pass only the fundamental frequency of the digital signal and suppressing the harmonics thereof.

In the illustrated embodiment, the low-pass LC filter 26 comprises of source terminating resistance 32, a first capacitor 34, an inductor 36, a second capacitor 38, load termination resistance 40 and load termination decoupling capacitor 42. Capacitor 42 ensures that the DC component of the output voltage is one half of the operating voltage of microcontroller 30. Preferably, the cutoff frequency of the low-pass LC filter 26 is chosen such that it lies above the operating frequency range of the guard voltage. However, if some attenuation of the fundamental frequency is tolerable, the cutoff frequency of the low-pass LC filter 26 could also lie slightly below the fundamental frequency, which may lead to a better suppression of the harmonics relative to the fundamental frequency. Preferably, filter topology and filter type are chosen such that for the given cutoff frequency, capacitance 38 is maximized. The purpose of this capacitance maximization is detailed later. In the illustrated embodiment, a 3-pole, 0.1 dB ripple Chebychev low-pass filter is used. This choice represents a good compromise between low component count leading to low cost, harmonics suppression and maximization of the capacitance 38. Obviously, other filter topologies can lead to similar results. A noticeable advantage of using a digital signal from a microcontroller in combination with an LC filter for generating the guard voltage is low overall cost. Except for the microcontroller 30, no active devices, like amplifiers consisting of transistors and/or operational amplifiers, are employed. Since a microcontroller is anyway required in the measurement system, its provision does not involve any extra costs.

The sense electrode 12 is connected with a so-called sense node 44 of the control and evaluation circuit 18 via the core conductor 46 of the shielded cable 20. The sense node 46 is the input node of the measurement electronics and the beginning of the measurement path. The measurement path of the control and evaluation circuit 18 includes, as major components, a multiplexer 48, a transimpedance amplifier 50 and a low-pass filter with a (fixed) gain and an offset correction 52.

The sense node 44 is connected to the common node of SPDT (single pole, double throw) multiplexer 48. The multiplexer 48 alternatingly connects the sense node 44 to the guard node 22 during one half of the period of the guard voltage and to the current input 54 of the transimpedance amplifier 50 during the other half of the period of the guard voltage. The transimpedance amplifier 50 has a current input, which, when left open, has a defined voltage equal to the alternating reference voltage. The switching action of the multiplexer 48 is controlled by a second PWM output 57 of the microcontroller 30. The frequencies of the signals on the PWM outputs 28 and 57 are identical and the software of the microcontroller controls the phase shift between these signals. The microcontroller 30 alternates the phase shift between two phase shift values, which are preferably 90 degrees apart. Measuring the current flowing into the sense node 44 for each of these phase shift values yields two measures, from which the complex impedance or the complex conductance between the sense electrode 12 and ground may be calculated.

The transimpedance amplifier 50 comprises a first capacitor 56 connected between the current input 54 of the transimpedance amplifier 50 and the guard node 22. This capacitance guarantees that the sense node 44 is always connected to the guard node via a comparatively small AC impedance, irrespective of the position of the multiplexer switch 48. Keeping the input AC impedance of the measurement electronics low between the sense node 44 and the guard node 22 compared to the parasitic impedance between the sense electrode 12 and the guard electrode 14, the impedance of the cable 20 and the impedance of EMI (electromagnetic interference) protection capacitor 58, implies that substantially all the current flowing through the unknown impedance 16 flows also through the measurement path starting with the multiplexer 48, instead of flowing into the guard node 22 through the parasitic impedances mentioned above. In this context, it is worthwhile noting that, since the demodulation is effected by multiplexer 48, the useful information is comprised in the DC component of the current that flows into the current input 54 of the transimpedance amplifier and that the DC component cannot flow away across capacitor 56. Accordingly, while the capacitor 56 deviates alternating current to the guard node 22, it does not reduce the sensitivity of the measurement electronics regarding the unknown impedance 16. Resistor 60 substantially defines the gain (or transimpedance) of the transimpedance amplifier 50. Resistor 62 and capacitor 64 ensure that the open-loop gain of the amplifier 66 and its feedback components has enough phase margin, preventing oscillation of the feedback system.

The low-pass filter with gain and offset correction 52 has as inputs the output of the transimpedance amplifier 50 and a third PWM output 68 of microcontroller 30. The output voltage of transimpedance amplifier 50 is typically too small to be directly read by the ADC (analog-to-digital converter) input 70 of microcontroller 30. Also, there is still an appreciably large amount of the guard sine wave present at the output 67 of the transimpedance amplifier 50. Therefore, the low pass filter with gain and offset correction 52 removes the residual guard sine wave at the output 67 of transimpedance amplifier 50 by low-pass filtering and amplifies the resulting DC voltage with a fixed gain. In order to avoid that the amplification leads to a DC voltage overdriving the ADC input 70 of microcontroller 30, an offset correction is applied by injecting a signal from the PWM output 68 of the microcontroller 30 into the input of low-pass filter with gain and offset correction 52. The resistance ratio between resistors 72 and 74 defines the offset correction range. Resistors 72, 74, 76 and 78, capacitors 80, 82 and the operational amplifier 84 form together a so-called multiple feedback (MFB) second order active low-pass filter. The DC voltage source 86 defines the DC operating point of the low pass filter with gain and offset 52. Typically, the DC voltage of DC voltage source 86 is chosen equal to one half of the supply voltage of the microcontroller 30.

For calibration purposes, a reference impedance (also: normative impedance) 88 is arranged, in parallel to the unknown impedance 16, between the sense node 44 and circuit ground. The reference impedance is arranged in series with a switch 90, which is controlled via a further digital output 92 of the microcontroller 30. The microcontroller 30 periodically opens and closes the switch 90 (e.g. at a rate between 10 Hz and 10 kHz) and thereby switches reference impedance 88 in parallel to the unknown impedance 16. For each switch position of switch 90, the microcontroller 30 measures a complex value. Let $\alpha$ denote the complex value obtained when the switch 90 is open and $\beta$ the complex value obtained when the switch 90 is closed. $\alpha$ is obtained by calculating $\alpha=\alpha_1+j\alpha_2$, where $\alpha_1$ is the voltage measured at microcontroller input 70 when the phase of the multiplexer 48 with respect to the guard sine wave is $\phi$ ($\phi$ need not be known, but it must be constant) and $\alpha_2$ is the voltage measured at microcontroller input 70 when the phase of the multiplexer 48 with respect to the guard sine wave is $\phi+90°$. For the measurements of both $\alpha_1$ and $\alpha_2$ the switch 90 is open. $\beta$ is obtained by calculating $\beta=\beta_1+j\beta_2$, where $\beta_1$ is the voltage measured at microcontroller input 70 when the phase of the multiplexer 48 with respect to the guard sine wave is $\phi$ (same value as for the determination of $\alpha$) and $\beta_2$ is the voltage measured at microcontroller input 70 when the phase of the multiplexer 48 with respect to the guard sine wave is $\phi+90°$. For the measurements of both $\beta_1$ and $\beta_2$ the switch 90 is closed. The difference $\beta-\alpha$ between these two measured complex values corresponds to the complex impedance of the reference impedance 88, because the reference impedance 88 is in parallel with the unknown impedance 16, which will be denoted $Z_X$ in the following. Since the complex impedance, $Z_{REF}$, of reference impedance 88 is known, the ratio between the difference $\beta-\alpha$ and the known complex value $Z_{REF}$ of the reference impedance can be used as a calibration factor. The microcontroller 30 thus divides the measured complex value $\alpha$ by the difference value $\beta-\alpha$ and multiplies the result with the known value $Z_{REF}$ of the reference impedance 88. (This can be deduced as follows: $Z_X/Z_{REF}=\alpha/(\beta-\alpha)$, therefore, $Z_X=Z_{REF}\alpha/(\beta-\alpha)$.)

In the illustrated embodiment, a second reference impedance 94 is provided. A multiplexer 96 connects it alternately to the current input 54 of the transimpedance amplifier or to the guard node 22. On the other side, the second reference impedance 94 is connected to circuit ground via a switch 98. The switching action of the multiplexer 96 is controlled by a fourth PWM output 100 of the microcontroller 30.

When the above-described measurements of $\alpha$ and $\beta$ are carried out, the microcontroller 30 preferably keeps the second reference impedance 94 connected to the guard node 22, so as to avoid that it enters as an offset into the measurement.

The second reference impedance 94 is preferably used in the following way. First, the multiplexer 48 is controlled such that it switches the sense electrode 12 to the guard node 22. The measurement electronics is thereby rendered insensitive to any changes of the unknown impedance 16. Via a further digital output 102, the microcontroller 30 closes the switch 98. The multiplexer 96 is then controlled to alternatingly connect the second reference impedance 94 to the guard node 22 during one half of the period of the guard voltage and to the current input 54 of the transimpedance amplifier 50 during the other half of the period of the guard voltage. The switching action of the multiplexer 94 is controlled by the fourth PWM output 100 of the microcontroller 30. The frequencies of the signals on the PWM outputs 28 and 100 are identical during this measurement and the software of the microcontroller 30 controls the phase shift between these signals. The microcontroller 30 alternates the phase shift between two phase shift values that are preferably 90 degrees apart. Measuring the current flowing into the second reference impedance 94 for each of these phase shift values yields two real-valued measures, herein denoted $\gamma_1$ and $\gamma_2$, or one complex value $\gamma=\gamma_1+j\gamma_2$, which corresponds to the complex impedance of the second reference impedance. This arrangement has the advantage that the reference impedance 94 is measured individually and independently from the unknown impedance. Assuming that the values $\alpha$ and $\gamma$ have been obtained using the same phase offset $\phi$, the microcontroller can calculate the unknown capacitance can as $Z_X=Z_{REF2}\alpha/\gamma$, where $Z_{REF2}$ is the known value of the second reference impedance 94. It is worthwhile noting that the second reference impedance 94 can be used as an alternative or a complement to the first reference impedance 88. Implementing both (or even further) reference impedances adds redundancy to the system and may be useful if a high fault detection probability is required.

Additionally, the sum of the offset capacitance between the common node and ground and the offset capacitance between output and ground of the multiplexer 96 can be measured, assuming that the parasitic capacitance of the multiplexer 96 is significantly less than the offset capacitance. For this measurement, the microcontroller 30 opens switch 98 but otherwise keeps the same system configuration as for the measurement of $\gamma$. The measurement yields in this case a complex value, hereinafter denoted $\gamma'$, which corresponds to the offset impedance (or the offset capacitance) of the multiplexer 96. Assuming that all the multiplexers used in the measurement electronics are substantially identical, the parasitic offset impedances thereof can be subtracted from the measured unknown impedance for a higher accuracy of the measurement.

As also illustrated in FIG. 1, the capacitive sensing device 10 may comprise a plurality of sense electrodes and/or guard electrodes. A second sense electrode 12a is connected to a second sense node 44a via the core conductor 46a of a shielded cable 20a. A multiplexer 48a is provided for connecting the sense node 44a alternatingly to the current input 54 of the transimpedance amplifier 50 and to the guard node 22. When the capacitive sensing device 10 measures the first unknown impedance 16 individually, the microcontroller 30 controls the multiplexer 48a such that the second sense electrode 12a is connected to the guard node 22. The microcontroller 30 controls the multiplexer 48a with a fifth PWM output 28a. The sensitivity of the second sense electrode 12a is reduced towards one side by means of a second shield electrode 14a, which is connected to the guard node 22 via the shield conductor 24a of the shielded cable 20a. EMI protection capacitor 58a, together with capacitor 38, guarantees that high-frequency currents may flow to circuit ground substantially without perturbing the transimpedance amplifier 50 and the other measurement electronics. When the capacitive sensing device 10 measures the second unknown impedance 16a individually, the microcontroller 30 controls the multiplexer 48 such that the first sense electrode 12 is connected to the guard node 22 while it operates the multiplexer 48a as it has been described above for the first multiplexer 48.

Whereas only to two antenna arrangements are shown in FIG. 1, it should be noted that more antenna arrangements could be connected in a similar way as shown.

Capacitors 38, 58 and 58a ensure that an RF current injected into the sensor cabling during the so-called BCI (bulk current injection) test substantially flows through capacitors 58 and 38 or 58a and 38 into circuit ground rather than into the measurement electronics. Additionally, residual RF current flowing into node 54 via the multiplexer 48 or 48a flows, to a large extent, into circuit ground across capacitors 56 and 38.

In a preferred implementation of the embodiment illustrated in FIG. 1, the following system parameters have been chosen:

resistance 32=330Ω
capacitance 34=2.7 nF
inductance 36=560 μH
capacitance 38=4.7 nF
resistance 40=3.3 kΩ
capacitance 42=10 nF
capacitance 56=47 nF
capacitance 58=470 pF
resistance 50=100 kΩ
resistance 62=100 kΩ
capacitance 64=1 nF
resistance 72=3.6 kΩ
resistance 74=33 kΩ
capacitance 80=22 nF
resistance 76=33 kΩ
resistance 78=10 kΩ
capacitance 82=680 pF
impedance 88=100 kΩ
impedance 94=100 kΩ
capacitance 58a=470 pF
voltage of DC voltage source 86=2.5 V
microcontroller supply voltage=5 V
operating frequency (i.e. frequency of the guard voltage) =125 kHz While specific embodiments have been described in detail, those skilled in the art will appreciate that various modifications and alternatives to those details could be developed in light of the overall teachings of the disclosure. Any numerical values indicated herein are also provided only for the purpose of illustration. Accordingly, the particular arrangements disclosed are meant to be illustrative only and not limiting as to the scope of the invention, which is to be given the full breadth of the appended claims and any and all equivalents thereof.

The invention claimed is:

1. A capacitive sensing device, comprising
an antenna electrode configured for emitting an alternating electric field in response to an alternating voltage caused in said antenna electrode;
a control and evaluation circuit configured to maintain said alternating voltage equal to an alternating reference voltage by injecting a current into said antenna electrode and to measure said current;
wherein said control and evaluation circuit includes
a microcontroller with a digital output for providing a digital signal;
and a low-pass filter operatively connected to said digital output for generating said alternating reference voltage by low-pass-filtering said digital signal, and
wherein said control and evaluation circuit comprises a transimpedance amplifier having a current input operatively connected to said antenna electrode, a reference voltage input operatively connected to said low-pass-filter for receiving said alternating reference voltage and an output operatively connected with said current input via a feedback network, said transimpedance amplifier being configured for preventing a difference in potential between said current input and said reference voltage input by causing a current to flow across said reference network and into said antenna electrode, said output being configured to output a measurement voltage indicative of said current.

2. The capacitive sensing device as claimed in claim 1, comprising a driven shield electrode operatively connected to said low-pass filter for having said alternating reference voltage applied to.

3. The capacitive sensing device as claimed in claim 2, comprising a shielded cable, said shielded cable comprising a core conductor and a shield conductor surrounding said core conductor, wherein said antenna electrode is operatively connected with said control and evaluation circuit via said core conductor and wherein said driven shield electrode is operatively connected to said low-pass filter via said shield conductor.

4. The capacitive sensing device as claimed in claim 1, wherein said low-pass filter operatively connected to said digital output comprises an LC low-pass filter.

5. The capacitive sensing device as claimed in claim 1, comprising at least one normative impedance controlledly switchable in parallel to said antenna electrode with a switch arranged in series with said at least one normative impedance and controlled by said microcontroller.

6. The capacitive sensing device as claimed in claim 1, wherein said microcontroller comprises a measurement input, wherein said output of said transimpedance amplifier is operatively connected with said measurement input via a further low pass filter, said further low-pass filter including an offset correction circuit.

7. The capacitive sensing device as claimed in claim 1, wherein said current input is operatively connected to said antenna electrode via a multiplexer, said multiplexer being configured to switch said antenna electrode alternatingly to said current input and to said reference voltage input.

8. The capacitive sensing device as claimed in claim 7, wherein said multiplexer is configured to switch said antenna electrode alternatingly to said current input during a first half of a period of said alternating reference voltage and to said reference voltage input during a second half of said alternating reference voltage.

9. The capacitive sensing device as claimed in claim 1, comprising a first shunt capacitor connected between said antenna electrode and said reference voltage input of said transimpedance amplifier and a second shunt capacitor connected between said reference voltage input and circuit ground.

10. A capacitive sensing device in accordance with claim 1,
wherein the transimpedance amplifier is configured to maintain the alternating voltage equal to an alternating reference voltage on a reference voltage node by injecting a current into the antenna electrode and to measure the current,
wherein the control and evaluation circuit further includes a multiplexer configured and arranged to switch said antenna electrode alternately to a current input of the transimpedance amplifier and to the alternating reference voltage node,
wherein the microcontroller is configured to control the multiplexer with a digital control signal,
wherein the multiplexer and the transimpedance amplifier and a low-pass filter operatively connected to the transimpedance amplifier form together a synchronous rectifier arrangement, and
wherein the current input node of the transimpedance amplifier is AC-coupled to the reference voltage node by a protection capacitor.

11. Combined capacitive sensing and heating system, comprising a capacitive sensing device as claimed in claim 1, wherein said antenna electrode is part of a heating circuit.

12. A capacitive sensing device, comprising
an antenna electrode configured for emitting an alternating electric field in response to an alternating voltage caused in the antenna electrode
and a control and evaluation circuit that includes
a transimpedance amplifier configured to maintain the alternating voltage equal to an alternating reference voltage on a reference voltage node by injecting a current into the antenna electrode and to measure the current,
a microcontroller,
and a multiplexer configured and arranged to switch said antenna electrode alternately to a current input of the transimpedance amplifier and to the alternating reference voltage node,
wherein the microcontroller is configured to control the multiplexer with a digital control signal, wherein the multiplexer and the transimpedance amplifier and a low-pass filter operatively connected to the transimpedance amplifier form together a synchronous rectifier arrangement, and wherein the current input node of the transimpedance amplifier is AC-coupled to the reference voltage node by a protection capacitor.

13. The capacitive sensing device as claimed in claim 12, comprising a second protection capacitor, wherein said second protection capacitor AC-couples the reference voltage node to circuit ground.

14. Combined capacitive sensing and heating system, comprising a capacitive sensing device as claimed in claim 12, wherein said antenna electrode is part of a heating circuit.

* * * * *